United States Patent
Yan

(10) Patent No.: US 12,435,843 B2
(45) Date of Patent: Oct. 7, 2025

(54) LED FILAMENT COMBINING MULTIPLE TYPES OF LED DIES

(71) Applicant: Technical Consumer Products, Inc, Aurora, OH (US)

(72) Inventor: Ellis Yan, Aurora, OH (US)

(73) Assignee: Technical Consumer Products, Inc., Aurora, OH (US)

(*) Notice: Subject to any disclaimer, the term of this patent is extended or adjusted under 35 U.S.C. 154(b) by 0 days.

(21) Appl. No.: 18/666,468

(22) Filed: May 16, 2024

(65) Prior Publication Data

US 2024/0392931 A1 Nov. 28, 2024

Related U.S. Application Data

(60) Provisional application No. 63/503,705, filed on May 22, 2023.

(51) Int. Cl.
| | | |
|---|---|---|
| *F21K 9/235* | (2016.01) | |
| *F21V 19/00* | (2006.01) | |
| *F21Y 113/13* | (2016.01) | |
| *F21Y 115/10* | (2016.01) | |

(52) U.S. Cl.
CPC .......... *F21K 9/235* (2016.08); *F21V 19/0025* (2013.01); *F21Y 2113/13* (2016.08); *F21Y 2115/10* (2016.08)

(58) Field of Classification Search
CPC .............................. F21K 9/235; F21V 19/0025
See application file for complete search history.

(56) References Cited

U.S. PATENT DOCUMENTS

| | | | |
|---|---|---|---|
| 2016/0195227 A1* | 7/2016 | Rooijmans | F21K 9/60 362/231 |
| 2019/0017657 A1* | 1/2019 | Kim | F21K 9/232 |
| 2019/0191516 A1* | 6/2019 | Li | C09K 11/885 |
| 2021/0005791 A1* | 1/2021 | Shi | H01L 33/58 |
| 2022/0132635 A1* | 4/2022 | Medricky | F21K 9/232 |
| 2022/0390073 A1* | 12/2022 | Weijers | F21K 9/232 |
| 2023/0070872 A1* | 3/2023 | Pi | H01L 25/0753 |

* cited by examiner

*Primary Examiner* — Christopher E Dunay
(74) *Attorney, Agent, or Firm* — Norton Rose Fulbright US LLP

(57) ABSTRACT

The present invention relates to a light emitting diode (LED) filament for use in filament lamps that outputs full spectrum light. In one aspect, the LED filament comprises a first plurality of LED dies that emit light within a first range of wavelengths and a second plurality of LED dies that emit light within a second range of wavelengths, where the first and second ranges do not overlap. The LED filament may be assembled using a plurality of die bonding processes. The LED dies may be arranged in a linear arrangement, a staggered arrangement, or combinations thereof. Additionally, the LED filament may be used in a lamp that includes the LED filaments coupled to a support mount within an envelope defining a cavity.

12 Claims, 5 Drawing Sheets

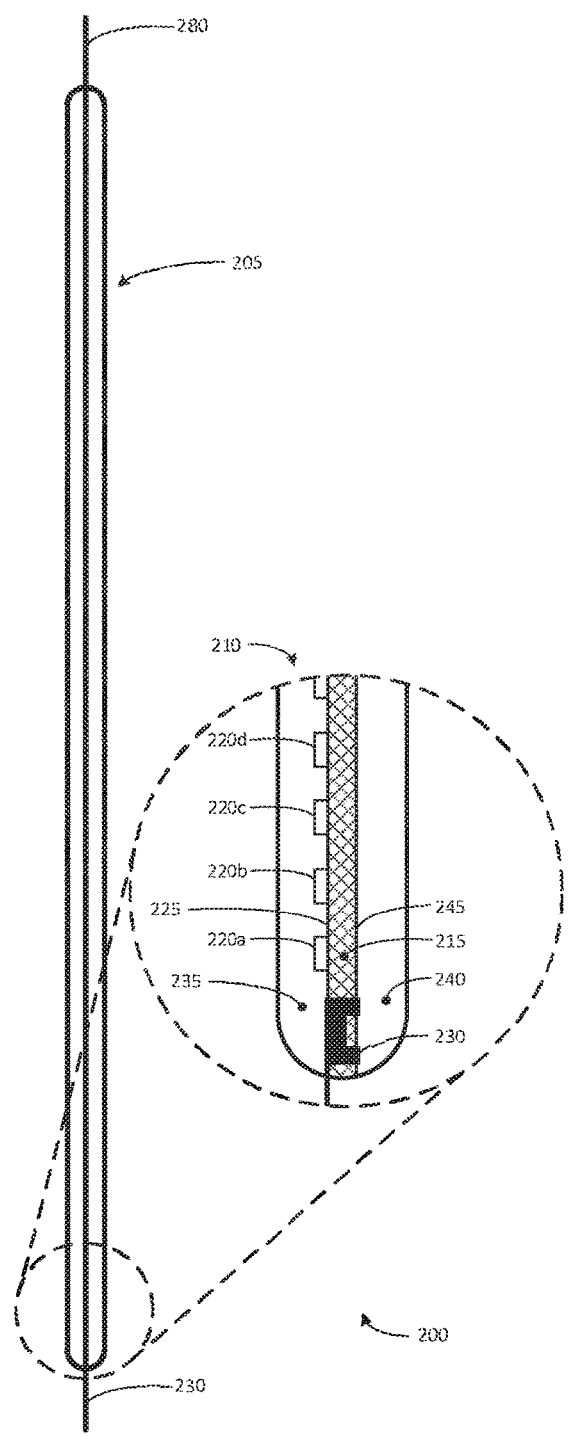
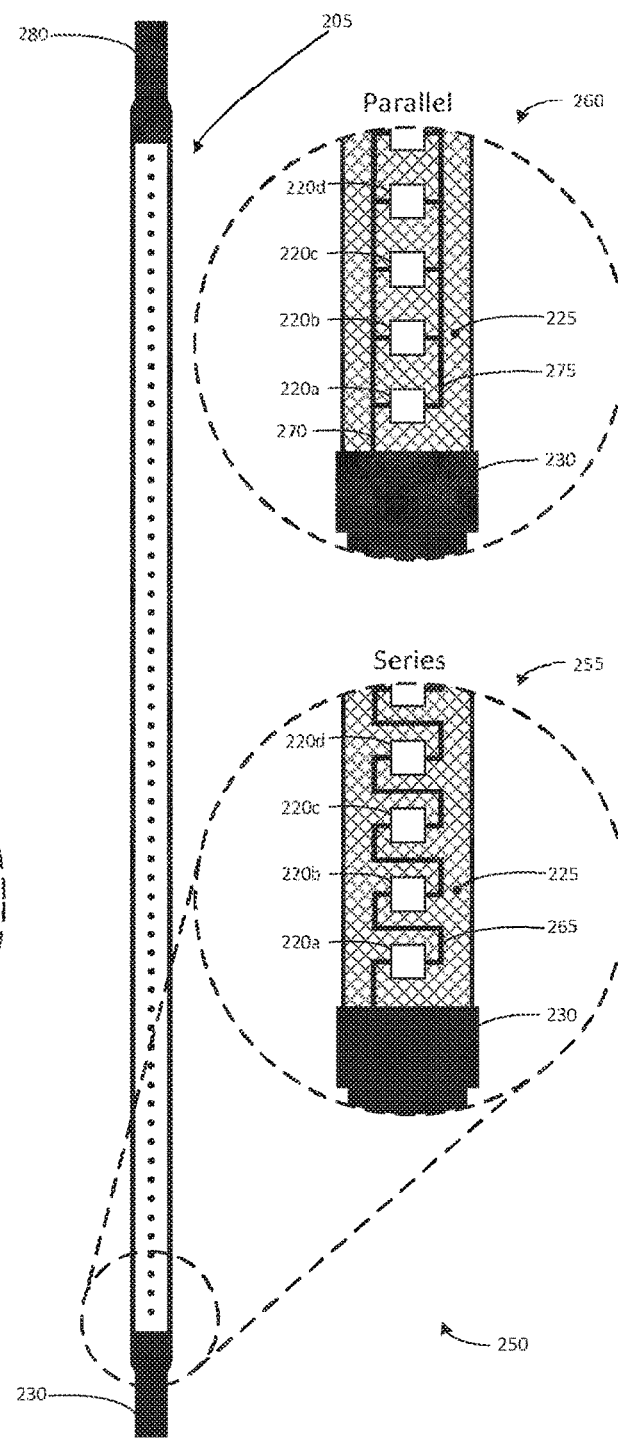
FIG. 2A
FIG. 2B

LED FILAMENT COMBINING MULTIPLE TYPES OF LED DIES

CROSS-REFERENCE TO RELATED APPLICATIONS

The present application claims priority to U.S. Provisional Patent Application No. 63/503,705, filed on May 22, 2023, the disclosure of which is incorporated herein by reference for all purposes.

TECHNICAL FIELD

The present disclosure relates generally to a light emitting diode (LED) filament light bulb, and more particularly to LED filaments that include multiple types of LED dies within the same LED filament.

BACKGROUND

Light emitting diode (LED) based lighting systems may offer several energy and reliability advantages over other types of lighting systems such as, for example, incandescent or fluorescent lighting. Thus, LED based lighting systems may increasingly be used to replace other existing lighting technologies. Although LED based lighting systems offer numerous advantages and benefits, there are still some challenges that may be faced when using this technology. For example, LED light bulbs have an unconventional appearance that is markedly different from that of an incandescent light bulb. This is because the LED chips that emit illumination are typically positioned in a horizontal orientation upon a base portion disposed within the dome of the LED light bulb. In contrast, an incandescent light bulb includes a wire filament that is suspended within the dome of the bulb and heated to glow with visible light.

SUMMARY

The present disclosure presents new and innovative LED filaments that can output full spectrum light using multiple LED dies. In some aspects, the techniques described herein relate to a light emitting diode (LED) filament that includes a first plurality of LED dies that emit light within a first range of wavelengths; a second plurality of LED dies that emit light within a second range of wavelengths, where the first range of wavelengths and the second range of wavelengths do not overlap.

In some aspects, the techniques described herein relate to a LED filament, where the first plurality of LED dies and the second plurality of LED dies are arranged in a staggered manner along a length of the LED filament.

In some aspects, the techniques described herein relate to a LED filament, where the first plurality of LED dies and the second plurality of LED dies are arranged in a linear manner along a length of the LED filament.

In some aspects, the techniques described herein relate to a LED filament, where the LED filament is prepared using a plurality of die bonding processes including: a first die bonding process that lays the first plurality of LED dies, and a second die bonding process that lays the second plurality of LED dies.

In some aspects, the techniques described herein relate to a LED filament, where the plurality of die bonding process are performed according to a plurality of range files including a first range file defining the first die bonding process and a second range file defining the second die bonding process.

In some aspects, the techniques described herein relate to a LED filament, where the LED filament outputs full spectrum light that mimics natural light sources.

In some aspects, the techniques described herein relate to a LED filament, where the full spectrum light has at least one of (i) a color rendering index (CRI) greater than or equal to 95, (ii) average values of R1-R15 greater than or equal to 90, (iii) an R12 average value greater than or equal to 85, (iv) a standard deviation color matching value greater than or equal to 4, or (v) combinations thereof.

In some aspects, the techniques described herein relate to a LED filament, where said full spectrum light emits light that includes the first range of wavelengths and the second range of wavelengths.

In some aspects, the techniques described herein relate to a LED filament, where the first range of wavelengths and the second range of wavelengths contain wavelengths greater than or equal to 400 nm and less than or equal to 470 nm.

In some aspects, the techniques described herein relate to a LED filament, where the LED filament has a width greater than or equal to 1.5 mm and less than or equal to 8 mm.

In some aspects, the techniques described herein relate to a LED filament, where the LED filament has a length greater than or equal to 20 mm and less than or equal to 150 mm.

In some aspects, the techniques described herein relate to a LED filament, further including a third plurality of LED dies that emit light within a third range of wavelengths, where the third range of wavelengths does not overlap with the first range of wavelengths or the second range of wavelengths.

In some aspects, the techniques described herein relate to a light emitting diode (LED) filament lamp including: an envelope defining a cavity; a support mount that extends into the cavity; a plurality of LED filaments coupled to the support mount, where each of at least a subset of the plurality of LED filaments include: a first plurality of LED dies that emit light within a first range of wavelengths; a second plurality of LED dies that emit light within a second range of wavelengths, where the first range of wavelengths and the second range of wavelengths do not overlap.

The features and advantages described herein are not all-inclusive and, in particular, many additional features and advantages will be apparent to one of ordinary skill in the art in view of the figures and description. Moreover, it should be noted that the language used in the specification has been principally selected for readability and instructional purposes, and not to limit the scope of the disclosed subject matter.

BRIEF DESCRIPTION OF THE FIGURES

FIG. 2A illustrates a side view of an LED filament 205 in according to an aspect of the present disclosure.

FIG. 2B illustrates a top view of the LED filament 205 without onboard current regulation according to certain embodiments of the invention, with inset magnified cut-away diagrams 255 and 260 of the cathode end of the LED filament 205 illustrating two alternative arrangements for LED dies.

DETAILED DESCRIPTION OF EXAMPLE EMBODIMENTS

Conventional LED filaments may typically use a single type of LED die, such as a single type of LED die arranged in one or more lines along the filament. While this approach is effective for producing a consistent and uniform light output, it can also result in a limited color spectrum and poor color rendering parameters for resulting lighting products, especially when compared to natural light sources or incandescent light bults. This can result because the light produced by these filaments tends to be biased towards certain wavelengths, which can make it difficult to accurately reproduce the colors of objects illuminated by the light. This limitation can be particularly problematic in settings where color accuracy is important, such as in photography, art studios, and the like. In such settings, conventional LED filaments may not be able to provide the level of color accuracy required, which can result in inaccurate color reproduction, poor contrast, and other issues.

Aspects of the present invention solve the problems identified above by providing various assemblies of light emitting diodes (also referred to as "LED dies"). One aspect provides LED filaments that contain multiple types of LED dies. For example, multiple die bonding processes may be used to deposit multiple types of LED dies onto the same LED filament, allowing for more natural, full spectrum light from a single LED filament (rather than combining multiple, disparate filaments. The LED dies may be arranged in a linear arrangement, a staggered arrangement, or combinations thereof within the LED filament. Such arrangements may allow for LED filaments that are capable of producing a wider range of colors with greater accuracy, such as to provide full spectrum light.

Figure 1:
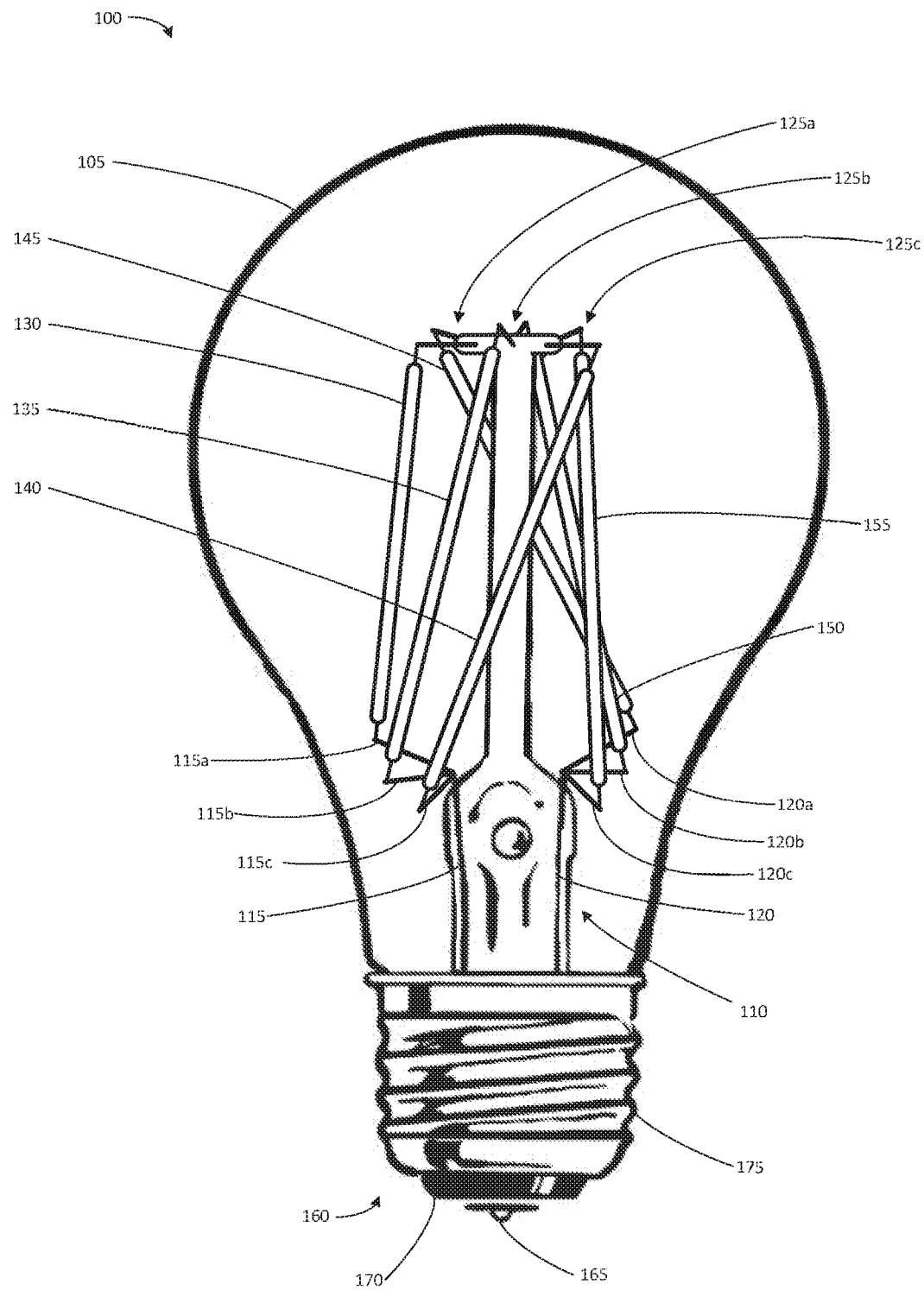
FIG. 1 illustrates a schematic view of an LED filament lamp according to an aspect of the present disclosure.

FIG. 1 illustrates a schematic view of an LED filament lamp 100 according to an aspect of the present disclosure. LED filament lamp 100 includes a transparent or translucent envelope 105 that defines a cavity. As illustrated, translucent envelope 105 is an A-lamp, but other lamp form factors are equally acceptable, including, but not limited to reflector lamps, PAR lamps, tubular lamps, and decorative lamps such as candle lamps. Envelope 105 may be made, for example, of glass or plastic and be transparent, frosted, or have a soft white coating.

LED filament lamp 100 includes a support mount 110 that extends into the cavity along an axis of the envelope 105. Support mount 110 may be made of the same material as the envelope 105. A support mount 110 may be sealed to envelope 105 in an airtight seal. The sealed envelope 105 may contain a gas mixture selected to dissipate heat generated within the envelope.

A first conductive lead 115 extends through support mount 110 to connect a positive terminal of a driver circuit to a series of first conductive supports 115a-115c. A second conductive lead 120 extends through the support mount 110 to connect a negative terminal of the dimmable LED driver circuit to a series of second conductive supports 120a-120c. First conductive supports 115a-115c and second conductive supports 120a-120c are supported by support mount 110 and extend outward into the cavity.

A series of upper conductive supports 125a-125c pass through support mount 110 at an end of the support mount 110 that is distal to the end where the first 115 and second 120 conductive leads extend through the support mount 110, and extend outward into the cavity. In one embodiment, upper conductive supports 125a-125c are electrically insulated from each other.

The LED filament lamp includes six LED filaments. Three LED filaments 130, 135, and 140 extend respectively between first conductive supports 115a-115c and upper conductive supports 125a-125c. The anode of LED filament 130 is conductively and mechanically attached to a distal end of first conductive support 115a, and the cathode of LED filament 130 is conductively and mechanically attached to a first end of upper conductive support 125a. LED filament 135 is similarly attached between first conductive support 115b and upper conductive support 125b, and LED filament 140 is similarly attached between first conductive support 115c and upper conductive supports 125c.

Three LED filaments 145, 150, and 155 extend respectively between upper conductive supports 125a-125c and second conductive supports 120a-120c. The anode of LED filament 145 is conductively and mechanically attached to first end of upper conductive support 125a and the cathode of LED filament 145 is conductively and mechanically attached to a distal end of second conductive support 120a. LED filament 150 is similarly attached between upper conductive support 125b and second conductive support 120b, and LED filament 155 is similarly attached between upper conductive supports 125c and second conductive support 120c.

The connections of the six LED filaments (130, 135, 140, 145, 150, and 155) described and illustrated, form three parallel LED arrays between the positive and negative terminals of the dimmable LED driver circuit (i.e., parallel LED arrays formed by LED filaments 130 and 145, LED filaments 135 and 150, and LED filaments 140 and 155).

A base cap 160 is affixed to the base of LED filament lamp 100. In the embodiment shown, the base cap 160 is an Edison-type cap with a foot contact 165 separated by insulation 170 from a screw thread contact 175. In other embodiments, other base types may be used, such as bayonet, GU, prong, and pin bases. In one embodiment, the dimmable LED driver circuit is concealed within base cap 160, and the hot and ground power supply leads for the dimmable LED driver circuit are connected to the foot contact 165 and screw contact 175, respectively.

FIG. 2A illustrates a side view 200 of an LED filament 205 in according to an aspect of the present disclosure. The LED filament 205 is without onboard current regulation. FIG. 2A further includes an inset magnified cross-section diagram 210 of the cathode end of LED filament 205.

LED filament 205 includes a substrate 215 with multiple LED dies 220a-220d placed on a first face 225 of the substrate 215. LED filament 205 also includes a first conductive terminal 230 at the cathode end and a second conductive terminal 280 at the anode end. A first adhesive bead 235 covers the first face 225 of the substrate 215 and the LED dies 220a-220d. A second adhesive bead 240 covers a second face 245 of the substrate 215.

LED dies 220a-220d may each be, for example, a 3 volt LED die. It will be understood that LED dies of smaller or larger voltage can be used with the embodiments disclosed herein. Although only four LED dies 220a-220d are illustrated in FIG. 2A, it will be understood that such illustration is for clarity and convenience and that substrate 215 can be arranged with any number of LED dies. In one example, approximately 24 LED dies are placed on substrate 215. In another example, up to approximately 36 LED dies are placed on substrate 215. The number of LED dies is only practically limited by the ability to fit LED dies on a substrate of a length short enough to fit within an LED lamp, and the ability to dissipate the heat generated by the dies.

Substrate 215 may be formed of a transparent or translucent material, such as transparent ceramic, glass, or sapphire to allow light to pass through the substrate 215. Further, substrate 215 may be formed of layers of transparent or translucent material bonded together or affixed together, for example with a translucent or transparent adhesive. Alternatively, the substrate 215 may formed of opaque material, such as fiberglass, non-transparent ceramic, or metal-core substrate. Where the substrate 215 is opaque, through holes may be placed in the substrate 215 between the LED dies 220a-220d to allow light to pass through the substrate 215.

The first adhesive bead 235 and the second adhesive bead 240 may include an adhesive that is clear when cured or dry. Suitable adhesives include, but are not limited to epoxy resin, silica gel, methyl silicone resin, phenyl silicone resin, methyl phenyl silicone resin, or modified silicone resin.

FIG. 2B illustrates a top view 250 of the LED filament 205 without onboard current regulation according to certain embodiments of the invention, with inset magnified cutaway diagrams 255 and 260 of the cathode end of the LED filament 205 illustrating two alternative arrangements for LED dies. Magnified cutaway diagram 255 illustrates a first embodiment, where the LED dies 220a-220d are connected in series by one or more conductive traces such as conductive trace 265 on the first face 225 of substrate 215. Magnified cutaway diagram 260 illustrates a second embodiment, where the LED dies 220a-200d are connected in parallel by a first conductive trace 270 and a second conductive trace 275 on the first face 225 of substrate 215. First 230 and second 280 conductive terminals (as applicable to both embodiments illustrated in cut away diagrams 255 and 260) are affixed to substrate 215 (for example by crimping, riveting, soldering, welding, or use of an adhesive material). In the series configuration of the LED filament 205 illustrated in cut away diagram 255, at the cathode end of the LED filament 205, first conductive terminal 230 is conductively connected by a conductive trace to the cathode of LED die 220a (i.e., the first LED die in the series with respect to the cathode end of the LED filament 205); and at the anode end of the LED filament 205, a second conductive terminal 280 is conductively connected by a conductive trace to the anode of the LED die in the series positioned at the end of the series (i.e., the last LED die in the series with respect to the cathode end of the LED filament 205).

In the parallel configuration of the LED filament 205 illustrated in cut away diagram 260, at the cathode end, the first conductive terminal 230 is conductively connected by conductive trace 270 to the cathodes of all LED dies 220a-220d (and all additional LED dies not illustrated); and at the anode end, the second conductive terminal 280 is conductively connected by conductive trace 275 to the anodes of all LED dies 220a-220d (and all additional LED dies not illustrated).

In certain implementations, one or more of the above-described LED filaments 130, 135, 140, 145, 150, 155, 205 may be implemented as an LED filament that includes a first plurality of LED dies that emit light within a first range of wavelengths and a second plurality of LED dies that emit light within a second range of wavelengths.

Figure 3:
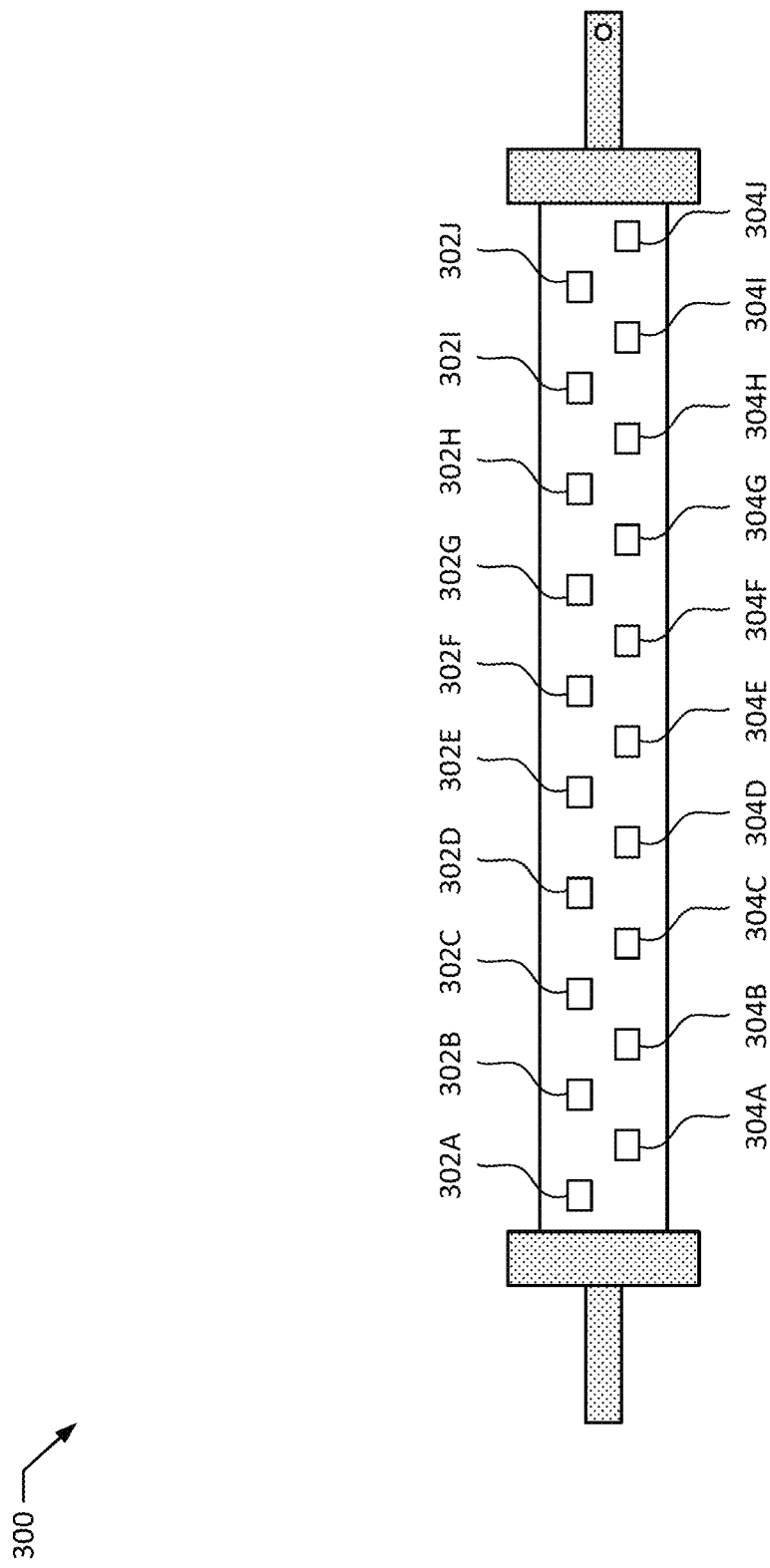
FIG. 3 illustrates an LED filament according to one aspect of the present disclosure.

In certain implementations, the first plurality of LED dies and the second plurality of LED dies are arranged in a staggered manner along a length of the LED filament. For example, FIG. 3 depicts an LED filament 300 according to one aspect of the present disclosure. The LED filament 300 may be an exemplary implementation of one or more of the LED filaments 130, 135, 140, 145, 150, 155, 205. The LED filament 300 includes a first plurality of LED dies 302A-J (collectively 302) and a second plurality of LED dies 304A-J (collectively 304), which may be configured to emit corresponding wavelengths of light as described further herein. FIG. 3 also includes a detailed view 306 of one of the LED dies. As can be seen in FIG. 3, the first plurality of LED dies 302 and the second plurality of LED dies 304 are arranged in a staggered manner. In particular, the first plurality of LED dies 302 is arranged along a first line that extends along the length of the LED filament and the second plurality of LED dies 304 is arranged along a second line that runs along the length of the LED filament. The first and second lines are parallel to one another and are offset from one another by a particular distance (such as 0.5 mm, 1 mm, 2 mm, and the like). Furthermore, the staggered arrangement of the LED dies 302, 304 is such that none of the first plurality of LED dies 302 are adjacent to any of the second plurality of LED dies 304 along a direction perpendicular to the length of the LED filament. It should be understood that the LED filament 300 is an exemplary implementation of a staggered arrangement of LED dies. In additional or alternative implementations, first and second LED dies may be adjacent to one another.

Figure 4:
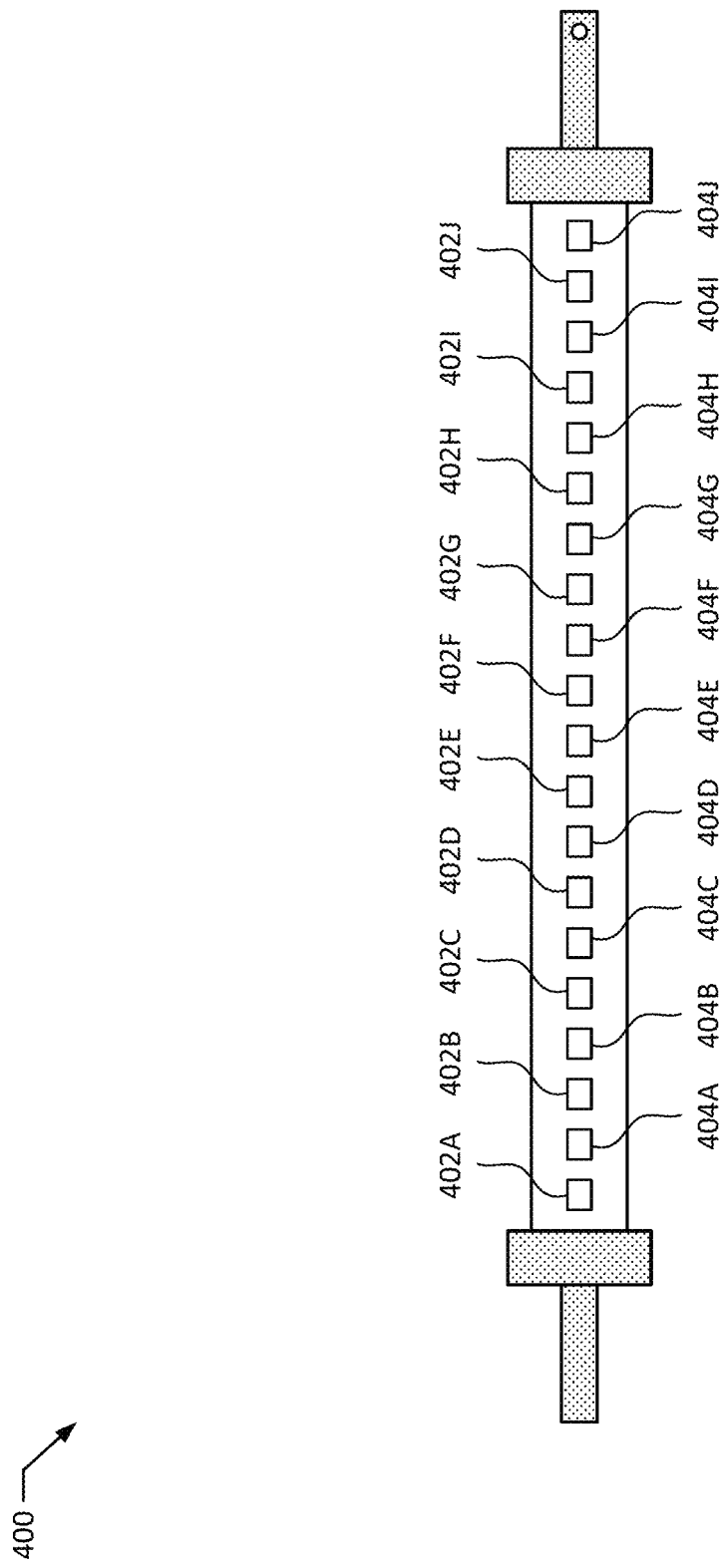
FIG. 4 illustrates an LED filament according to one aspect of the present disclosure.

In certain implementations, the first plurality of LED dies and the second plurality of LED dies are arranged in a linear manner along a length of the LED filament. For example, FIG. 4 depicts an LED filament 400 according to one aspect of the present disclosure. The LED filament 400 may be an exemplary implementation of one or more of the LED filaments 130, 135, 140, 145, 150, 155, 205. The LED filament 400 includes a first plurality of LED dies 402A-J (collectively 402) and a second plurality of LED dies 404A-J (collectively 404). FIG. 4 also includes a detailed view 406 of one of the LED dies. As can be seen in FIG. 4, the first plurality of LED dies 402 and the second plurality of LED dies 404 are arranged in a linear manner. In particular, the first plurality of LED dies 402 and the second plurality of LED dies 404 are arranged along a first line that extends along the length of the LED filament. As depicted, the first plurality of LED dies 402 and the second plurality of LED dies 404 are alternatingly arranged along the first line. It should be understood that the LED filament 400 is an exemplary implementation of a linear arrangement of LED dies. In additional or alternative implementations, first and second LED dies may not be alternatingly arranged along the same line. For example, two of the first plurality of LED dies may be followed by two of the second plurality of LED dies. As another example, there may be twice as many of the first plurality of LED dies as there are of the second plurality of LED dies. In such instances, two of the first plurality of LED dies may be followed by one of the second plurality of LED dies.

In certain implementations, the LED filament 130, 135, 140, 145, 150, 155, 205, 300, 400 may include more than two types of LED dies. For example, the LED filament 130, 135, 140, 145, 150, 155, 205, 300, 400 may include a third plurality of LED dies that emit light within a third range of wavelengths, where the third range of wavelengths does not overlap with the first range of wavelengths or the second range of wavelengths. In certain implementations, LED filaments 130, 135, 140, 145, 150, 155, 205, 300, 400 according to the present disclosure may include LED dies of different types that are arranged in both a linear manner and a staggered manner along the length of the LED filament 130, 135, 140, 145, 150, 155, 205, 300, 400. For example, an LED filament 130, 135, 140, 145, 150, 155, 205, 300, 400 may contain four different types of LED dies. A first and second type of LED dies may be arranged in a linear manner in a first line along the length of the filament and a third and fourth type of LED dies may be arranged in a linear manner in a second line along the length of the filament. In certain implementations, the first line and the second line may be staggered relative to one another, such that the LED dies are arranged in both a staggered and linear fashion.

In certain implementations, the LED filament 130, 135, 140, 145, 150, 155, 205, 300, 400 may be assembled according to a die bonding process. For example, a die bonding process may be performed to lay or otherwise deposit semiconductor dies onto a substrate to form the LED dies and the LED filament 130, 135, 140, 145, 150, 155, 205, 300, 400. During the die bonding process, a substrate may first be cleaned to remove any impurities or contaminants that could interfere with the bonding process. This may be done using a combination of chemical and mechanical cleaning methods, such as ultrasonic cleaning or plasma cleaning. Once the substrate is clean, the substrate may be coated with an adhesive material to bond the semiconductor die to the substrate. The adhesive material may include epoxy, solder paste, and the like. The semiconductor die may then be deposited onto the substrate to form the dies. Once the die is in place, pressure and heat may be applied to bond the die to the substrate. The pressure and/or heat may activate the adhesive material and help to ensure a secure bond between the die and the substrate.

In certain implementations, the LED filament 130, 135, 140, 145, 150, 155, 205, 300, 400 is formed using a plurality of die bonding processes. For example, the plurality of die bonding process may include a first die bonding process that lays the first plurality of LED dies 302, 402 and a second die bonding process that lays the second plurality of LED dies 304, 404.

In certain implementations, the die bonding process(es) may be performed according to one or more range files. In certain implementations, range files may be used to define the die bonding processes for an LED filament 130, 135, 140, 145, 150, 155, 205, 300, 400. A range file may include specific instructions for each step of the die bonding process, such as the cleaning, coating, placement, pressure, and heat application steps. The range file may also include information such as the type of adhesive material to be used, the amount of pressure to be applied, and the specific temperature and duration of the heating process. For example, the range files may include a first range file defining the first die bonding process and a second range file defining the second die bonding process.

In certain implementations, assembling the LED filament 130, 135, 140, 145, 150, 155, 205, 300, 400 may further include performing a wire bonding process. Wire bonding may include affixing wire, such as gold wire, between adjacent LED dies. This may be done to connect the individual dies and create a continuous electrical circuit within the filament. In certain implementations, an ultrasonic transducer may generate high-frequency vibrations that are used to bond the wire to the LED dies. A bonding capillary may be used to hold and position the wire during the bonding process. For example, during the wire bonding process, the bonding capillary may be positioned over the LED die and the wire may be fed through the capillary. The capillary may then be lowered onto the LED die, and the ultrasonic transducer may be activated to apply pressure and high-frequency vibrations to the wire. This may cause the wire to bond to the LED die, creating a secure electrical connection. The wire bonding process may be repeated for each LED die in the filament, creating a continuous electrical circuit between all of the individual dies. In various implementations, the LED dies may be wired in series, in parallel, or a combination thereof.

In certain implementations, after performing the die bonding and wire bonding processes, an epoxy layer (such as epoxy silicone) may be added to one or both sides of the LED filament 130, 135, 140, 145, 150, 155, 205, 300, 400. The epoxy layer may offer protection for the LED filament 130, 135, 140, 145, 150, 155, 205, 300, 400 (such as protection for the LED dies and the wires). For example, the epoxy layer may protect the LED filament 130, 135, 140, 145, 150, 155, 205, 300, 400 from damage due to mechanical stress, temperature changes, and other environmental factors. The epoxy layer may additionally or alternatively provide additional mechanical support to the LED filament 130, 135, 140, 145, 150, 155, 205, 300, 400, helping to prevent the LED filament 130, 135, 140, 145, 150, 155, 205, 300, 400 from breaking or becoming damaged during handling or use.

In certain implementations, assembly of the LED filament 130, 135, 140, 145, 150, 155, 205, 300, 400 may further include testing and packaging. Testing may include electrical tests, optical tests, and environmental tests. Electrical tests may be performed to ensure that the LED filament 130, 135, 140, 145, 150, 155, 205, 300, 400 operates within the specified voltage and current ranges. Optical tests may be performed to measure the brightness and color of the LED filament 130, 135, 140, 145, 150, 155, 205, 300, 400 and to ensure that it meets the required optical specifications. Environmental tests may be performed to evaluate the performance of the LED filament 130, 135, 140, 145, 150, 155, 205, 300, 400 under various conditions, such as high temperature, humidity, or vibration. Packaging may include packing the filament into other components (such as components used in assembling a lamp).

To fit within corresponding lamps (such as the lamp 100 or similar lamps), the LED filament 130, 135, 140, 145, 150, 155, 205, 300, 400 may have particular physical dimensions. In certain implementations, the LED filament 130, 135, 140, 145, 150, 155, 205, 300, 400 has a width greater than or equal to 1.5 mm and less than or equal to 8 mm. In certain implementations, the LED filament 130, 135, 140, 145, 150, 155, 205, 300, 400 has a length greater than or equal to 20 mm and less than or equal to 150 mm.

In certain implementations, the LED dies may be arranged based on the physical dimensions of the LED filament 130, 135, 140, 145, 150, 155, 205, 300, 400. For example, if the LED filament 130, 135, 140, 145, 150, 155, 205, 300, 400 is 1.5 mm wide, the LED filament 130, 135, 140, 145, 150, 155, 205, 300, 400 may only have space for a single row of LED dies. If the LED filament 130, 135, 140, 145, 150, 155, 205, 300, 400 includes two types of LED dies, the LED dies may accordingly be arranged in a linear manner in one row along the length of the LED filament 130, 135, 140, 145, 150, 155, 205, 300, 400. As another example, if the LED filament 130, 135, 140, 145, 150, 155, 205, 300, 400 is 3 mm wide, the LED filament 130, 135, 140, 145, 150, 155, 205, 300, 400 may have room for two rows of LED dies. If the LED filament 130, 135, 140, 145, 150, 155, 205, 300, 400 needs two types of LED dies, the LED dies may be arranged in a staggered manner with each type of die in a separate row along the length of the filament. If, on the other hand, the LED filament 130, 135, 140, 145, 150, 155, 205, 300, 400 needs four types of LED dies, the LED dies may be arranged in both a linear and staggered manner by arranging the first and second types in a linear manner along one row and arranging the third and fourth types in a linear manner along another row that is staggered relative to the first row.

In certain implementations, the first range of wavelengths and the second range of wavelengths contain wavelengths greater than or equal to 400 nm and less than or equal to 470 nm. In certain implementations, the first range of wavelengths and the second range of wavelengths do not overlap. In certain implementations, LED dies within the LED filament 130, 135, 140, 145, 150, 155, 205, 300, 400 may have a particular size, such as 1 nm, 5 nm, 10 nm, 15 nm, and the like. In certain implementations, one or both of the first range of wavelengths and the second range of wavelengths may be 5 nm in size. For example, the first range of wavelengths may be 405-410 nm and the second range of wavelengths may be 450-455 nm.

In certain implementations, the LED filament 130, 135, 140, 145, 150, 155, 205, 300, 400 outputs full spectrum light that mimics natural light sources. In particular, when emitting light using all of its LED dies, the LED filament 130, 135, 140, 145, 150, 155, 205, 300, 400 may output full spectrum light. For example, the combination of the first range of wavelengths and the second range of wavelengths may form full spectrum light. In implementations where the LED filament 130, 135, 140, 145, 150, 155, 205, 300, 400 includes more than two types of LED dies, the combined wavelengths from all of the dies may form full spectrum light.

In certain implementations, the full spectrum light has at least one of (i) a general color rendering index (CRI) greater than or equal to 95, (ii) an extended CRI greater than or equal to 90, (iii) an R12 average value greater than or equal to 85, (iv) a standard deviation color matching (SDCM) value greater than or equal to 4, or (v) combinations thereof.

The CRI, or Color Rendering Index, may be a quantitative measure of the ability of a light source to accurately reproduce the colors of various objects when compared to an ideal or natural light source (such as sunlight). The CRI may be expressed as a number between 0 and 100, with higher values indicating that colors appear more natural under that particular light source. The CRI may be determined by comparing the colors produced when exposing predefined color samples to ideal light sources and a light source being measured (such as the LED filament 130, 135, 140, 145, 150, 155, 205, 300, 400). The accuracy of how each of the color samples may be represented as corresponding R values ranging from 0 to 100. The most commonly used value of CRI is the general CRI (Ra), which is calculated using the average value of R1-R8 values. An extended CRI (Re) may be determined, which uses the average value of R1-R15 indices. The R1 index may correspond to a light grayish red color, the R2 index may correspond to a dark grayish yellow color, the R3 index may correspond to a strong yellow green color, the R4 index may correspond to a moderate yellowish green color, the R5 index may correspond to a light bluish green color, the R6 index may correspond to a light blue color, the R7 index may correspond to a light violet color, the R8 index may correspond to a light reddish purple color, the R9 index may correspond to a strong red color, the R10 index may correspond to a strong yellow color, the R11 index may correspond to a strong green color, the R12 index may correspond to a strong blue color, the R13 index may correspond to a light yellowish pink color, the R14 index may correspond to a moderate olive green color, and the R15 index may correspond to an Asian skin color.

Figure 5:
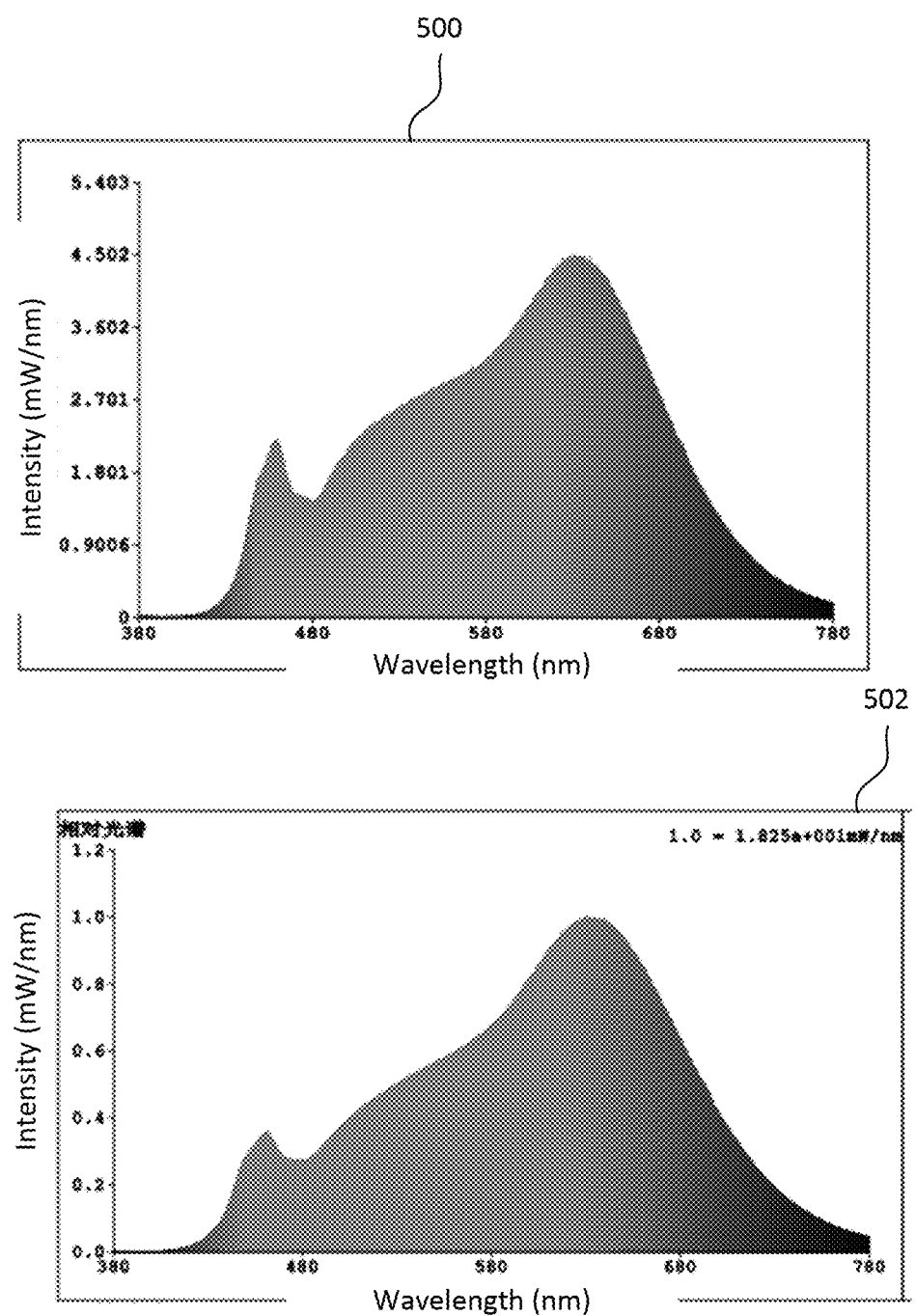
FIG. 5 illustrates light spectrums produced by LED filaments according to one aspect of the present disclosure.

FIG. 5 depicts light spectrums 500, 502 from LED filaments assembled according to the techniques discussed in the present disclosure. For example, the light spectrum 500 may be exemplary light spectrums from the LED filament 300, the LED filament 400, and the like. As another example, the light spectrum 502 may be an exemplary light spectrum from a lamp made using the LED filament 300, the LED filament, and the like. The light spectrums show light intensity values at different wavelengths. The light spectrums 500, 502 and their corresponding light sources have the properties shown in Table 1 and thus represent full spectrum light sources, which comply with the above standards for full spectrum light sources.

TABLE 1

| Parameter | Value for Light Spectrum 500 | Value for Light Spectrum 502 |
| --- | --- | --- |
| R1 | 97.47 | 98.22 |
| R2 | 98.16 | 98.17 |
| R3 | 99.28 | 99.37 |
| R4 | 97.38 | 98.00 |
| R5 | 97.45 | 97.80 |
| R6 | 96.07 | 95.33 |
| R7 | 96.74 | 95.95 |
| R8 | 96.99 | 94.94 |
| R9 | 96.11 | 90.29 |
| R10 | 96.98 | 97.12 |
| R11 | 95.71 | 96.13 |
| R12 | 86.16 | 88.19 |
| R13 | 97.30 | 97.84 |
| R14 | 98.73 | 98.97 |
| R15 | 98.06 | 98.17 |
| Ra | 97.44 | 97.22 |
| Re | 96.57 | 96.30 |

In certain implementations, the LED filament 130, 135, 140, 145, 150, 155, 205, 300, 400 may be included with a lamp, such as the lamp 100. For example, the LED filament 130, 135, 140, 145, 150, 155, 205, 300, 400 may be included within an LED lamp that includes an envelope defining a cavity and a support mount that extends into the cavity. A plurality of LED filaments 130, 135, 140, 145, 150, 155, 205, 300, 400 may be coupled to the support mount. Each of the LED filaments 130, 135, 140, 145, 150, 155, 205, 300, 400 may be implemented according to one or more of the LED filaments 130, 135, 140, 145, 150, 155, 205, 300, 400 discussed above. For example, each of the LED filaments 130, 135, 140, 145, 150, 155, 205, 300, 400 may include a first plurality of LED dies 302, 402 that emit light within a first range of wavelengths and a second plurality of LED dies 304, 404 that emit light within a second range of wavelengths. In certain implementations, the first range of wavelengths and the second range of wavelengths do not overlap.

While the forms of apparatus and methods herein described constitute preferred embodiments of this invention, it is to be understood that the invention is not limited to these precise forms of apparatus and methods, and the changes may be made therein without departing from the scope of the invention.

All of the disclosed methods and procedures described in this disclosure can be implemented using one or more computer programs or components. These components may be provided as a series of computer instructions on any conventional computer readable medium or machine readable medium, including volatile and non-volatile memory, such as RAM, ROM, flash memory, magnetic or optical disks, optical memory, or other storage media. The instructions may be provided as software or firmware, and may be implemented in whole or in part in hardware components such as ASICs, FPGAs, DSPs, or any other similar devices. The instructions may be configured to be executed by one or more processors, which when executing the series of computer instructions, performs or facilitates the performance of all or part of the disclosed methods and procedures.

It should be understood that various changes and modifications to the examples described here will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A light emitting diode (LED) filament comprising:
   a first plurality of LED dies that emit light within a first range of wavelengths; and
   a second plurality of LED dies that emit light within a second range of wavelengths,
   wherein the first range of wavelengths and the second range of wavelengths do not overlap, and wherein the first plurality of LED dies and the second plurality of LED dies are arranged in a staggered manner along a length of the LED filament, the first plurality of LED dies and the second plurality of LED dies being non-adjacent to one another in a first direction parallel to the length of the LED filament and in a second direction perpendicular to the length of the LED filament.

2. The LED filament of claim 1, wherein the LED filament is prepared using a plurality of die bonding processes comprising:
   a first die bonding process that lays the first plurality of LED dies, and
   a second die bonding process that lays the second plurality of LED dies.

3. The LED filament of claim 2, wherein the plurality of die bonding process are performed according to a plurality of range files comprising a first range file defining the first die bonding process and a second range file defining the second die bonding process.

4. The LED filament of claim 1, wherein the LED filament outputs full spectrum light that mimics natural light sources.

5. The LED filament of claim 4, wherein the full spectrum light has at least one of (i) a color rendering index (CRI) greater than or equal to 95, (ii) average values of R1-R15 greater than or equal to 90, (iii) an R12 average value greater than or equal to 85, (iv) a standard deviation color matching value greater than or equal to 4, or (v) combinations thereof.

6. The LED filament of claim 4, wherein said full spectrum light emits light that includes the first range of wavelengths and the second range of wavelengths.

7. The LED filament of claim 1, wherein the LED filament has a width greater than or equal to 1.5 mm and less than or equal to 8 mm.

8. The LED filament of claim 1, wherein the LED filament has a length greater than or equal to 20 mm and less than or equal to 150 mm.

9. The LED filament of claim 1, further comprising a third plurality of LED dies that emit light within a third range of wavelengths, wherein the third range of wavelengths does not overlap with the first range of wavelengths or the second range of wavelengths.

10. A light emitting diode (LED) filament lamp comprising:
    an envelope defining a cavity;
    a support mount that extends into the cavity;
    a plurality of LED filaments coupled to the support mount, wherein each of at least a subset of the plurality of LED filaments comprise:
       a first plurality of LED dies that emit light within a first range of wavelengths; and
       a second plurality of LED dies that emit light within a second range of wavelengths,
       wherein the first range of wavelengths and the second range of wavelengths do not overlap, and wherein the first plurality of LED dies and the second plurality of LED dies are arranged in a staggered manner along a length of the LED filament, the first plurality of LED dies and the second plurality of LED dies being non-adjacent to one another in a first direction parallel to the length of the respective LED filament and in a second direction perpendicular to the length of the respective LED filament.

11. The LED filament of claim 1, wherein the first range of wavelengths and the second range of wavelengths have a size of 10 nm or less.

12. The LED filament of claim 1, wherein the first range of wavelengths and the second range of wavelengths contain wavelengths greater than or equal to 400 nm and less than or equal to 470 nm.

* * * * *